(12) United States Patent
Gottlob et al.

(10) Patent No.: US 10,785,840 B2
(45) Date of Patent: Sep. 22, 2020

(54) COLOR-MIXING LED COMPONENT AND METHOD OF PRODUCTION THEREFOR

(71) Applicant: VISHAY SEMICONDUCTOR GMBH, Heilbronn (DE)

(72) Inventors: Heinrich Gottlob, Nordheim (DE); Franz Rettenmeier, Kirchheim am Neckar (DE)

(73) Assignee: VISHAY SEMICONDUCTOR GMBH, Heilbronn (DE)

( * ) Notice: Subject to any disclaimer, the term of this patent is extended or adjusted under 35 U.S.C. 154(b) by 0 days.

(21) Appl. No.: 16/462,132

(22) PCT Filed: Nov. 2, 2017

(86) PCT No.: PCT/EP2017/078057
§ 371 (c)(1),
(2) Date: May 17, 2019

(87) PCT Pub. No.: WO2018/091274
PCT Pub. Date: May 24, 2018

(65) Prior Publication Data
US 2019/0342970 A1 Nov. 7, 2019

(30) Foreign Application Priority Data
Nov. 18, 2016 (DE) .......................... 10 2016 122 209

(51) Int. Cl.
*H05B 45/24* (2020.01)
*H01L 25/075* (2006.01)
(Continued)

(52) U.S. Cl.
CPC ......... *H05B 45/24* (2020.01); *H01L 25/0753* (2013.01); *H01L 27/153* (2013.01); *H01L 33/62* (2013.01)

(58) Field of Classification Search
None
See application file for complete search history.

(56) References Cited

U.S. PATENT DOCUMENTS

| 6,218,790 B1 * | 4/2001 | Jansa | H01L 33/62 315/291 |
| 8,569,208 B1 * | 10/2013 | Ribi | B41M 5/3331 503/216 |

(Continued)

FOREIGN PATENT DOCUMENTS

| DE | 19814495 A1 | 9/1999 |
| DE | 102008028654 A1 | 12/2009 |

(Continued)

OTHER PUBLICATIONS

International Search Report and Written Opinion dated Feb. 20, 2018, corresponding application PCT/EP2017/078057.

(Continued)

*Primary Examiner* — Crystal L Hammond
(74) *Attorney, Agent, or Firm* — Volpe and Koenig, P.C.

(57) ABSTRACT

A color mixing light emitting diode (LED) assembly comprises a carrier and at least three LEDs that are arranged on the carrier and configured to emit light in mutually different colors and together generate an output radiation that corresponds to an additive color mix, wherein each of the LEDs has an individual emission characteristic. The LED assembly furthermore comprises a respective driver input for each of the LEDs to supply the LEDs with electrical energy, wherein the emission characteristics of the LEDs are dependent on the respective energy supply so that the color mix of the output radiation can be set by varying the respective energy supply at the driver inputs. The LED assembly has a calibration information element that includes at least one readable calibration value for each of the LEDs that represents the individual emission characteristic of the respective LED.

20 Claims, 1 Drawing Sheet

(51) Int. Cl.
*H01L 27/15* (2006.01)
*H01L 33/62* (2010.01)

(56) References Cited

U.S. PATENT DOCUMENTS

| | | | |
|---|---|---|---|
| 2006/0193133 A1 | 8/2006 | Von Der Brelie | |
| 2011/0299267 A1* | 12/2011 | Levon | F21V 5/10 362/84 |
| 2014/0160220 A1* | 6/2014 | Goldau | B42D 25/00 347/232 |
| 2015/0028367 A1* | 1/2015 | Frei | H01L 33/62 257/88 |
| 2015/0369658 A1 | 12/2015 | Selverian et al. | |

FOREIGN PATENT DOCUMENTS

| | | |
|---|---|---|
| DE | 102008059468 A1 | 6/2010 |
| DE | 102012018760 A1 | 3/2013 |
| DE | 102012101818 A1 | 9/2013 |
| WO | 2016206996 A1 | 12/2016 |

OTHER PUBLICATIONS

German Patent and Trademark Office prior art search mailed Jul. 21, 2017, corresponding application No. DE 10 2016 122 209.7.

\* cited by examiner

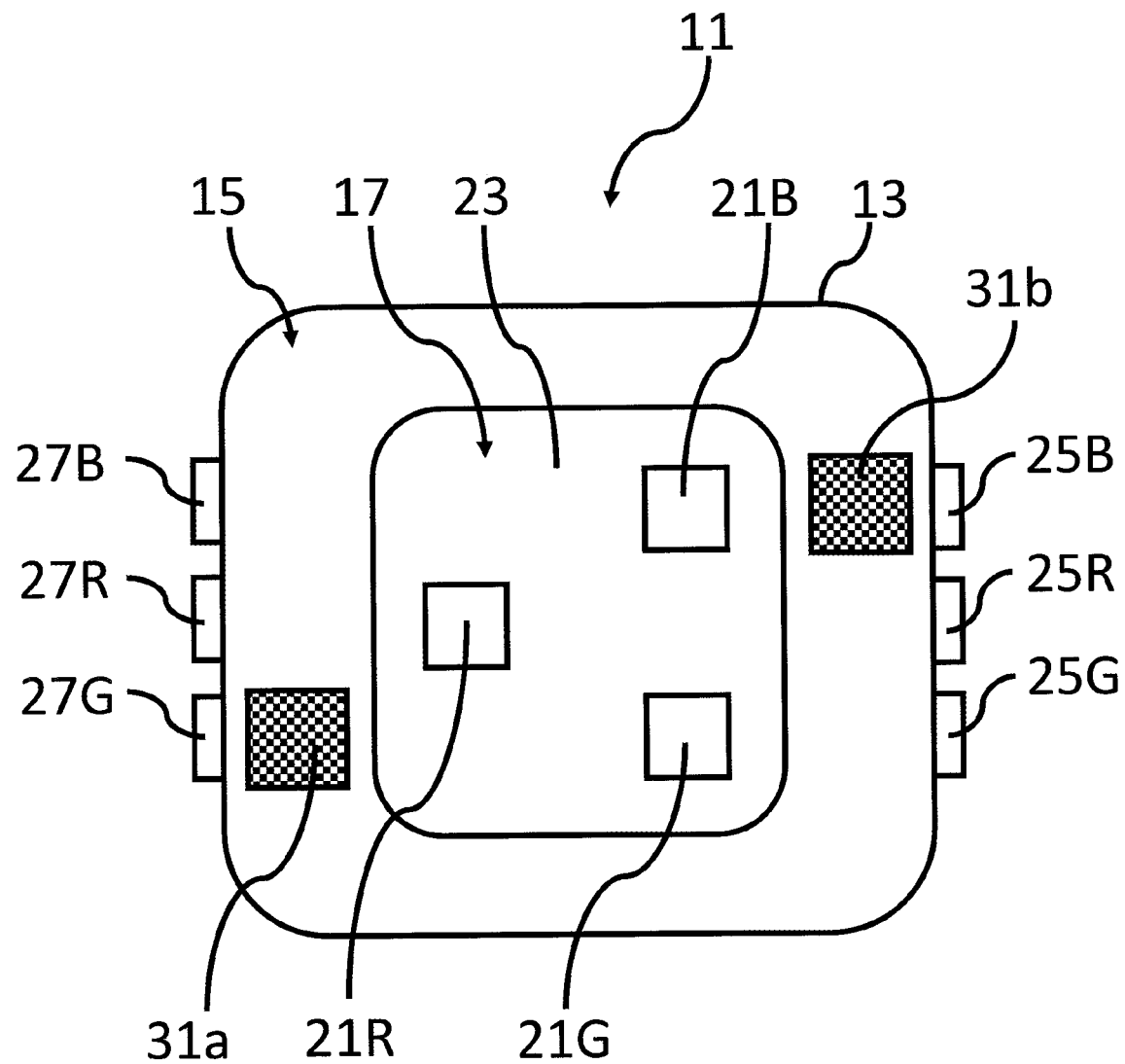

COLOR-MIXING LED COMPONENT AND METHOD OF PRODUCTION THEREFOR

CROSS REFERENCE TO RELATED APPLICATIONS

This application is a 371 application of International Patent Application No. PCT/EP2017/078057, filed Nov. 2, 2017, which claims priority to Deutsch Patent Application No. 10 2016 122 209.7, filed Nov. 18, 2016, both of which are incorporated herein by reference as if fully set forth.

FIELD OF INVENTION

The present invention relates generally to an LED assembly. More particularly, the invention relates to a color mixing LED assembly.

BACKGROUND

Color mixing light emitting diode (LED) assemblies are used various fields such as general illumination, automobile passenger compartment illumination, and background illumination of displays. Currently, there can be visually perceptible differences between the generated output radiation between different LED assemblies of the same type under the same operating conditions. This is unwanted when a plurality of LED assemblies of the same kind are arranged next to one another and should generate an output radiation that is as homogeneous as possible.

It is possible to classify the light emitting diodes according to different parameters of their emission characteristics such as their dominant wavelength, their spectral centroid, or their luminous intensity. The light emitting diodes can therefore be tested with respect to these different parameters by the manufacturer, with the respective light emitting diode being associated with one of a plurality of predefined classes for each of the different parameters. Light emitting diodes that are associated with the same classes with respect to the different parameters of their emission characteristic can thus be selected for the manufacture of a plurality of LED assemblies that should generate the same output radiation relative to one another so that the LED assemblies coincide with respect to their output radiation. Such a selection process, however, requires an undesirably high logistic effort since a large number of possible combinations of parameters and parameter classes of the emission characteristic has to be taken into account or kept available.

SUMMARY

A color mixing LED assembly in accordance with the present disclosure may comprise a carrier and at least three light emitting diodes that are arranged on the carrier and configured to emit light in mutually different colors and together generate an output radiation that corresponds to an additive color mix, wherein each of the light emitting diodes has an individual emission characteristic. The color mixing LED assembly may further comprise a respective driver input for each of the light emitting diodes to supply the light emitting diodes with electrical energy, wherein the emission characteristics of the light emitting diodes are dependent on the respective energy supply so that the color mix of the output radiation can be set by varying the respective energy supply at the driver inputs. The LED assembly may further comprise at least one calibration information element that includes at least one readable calibration value for each of the light emitting diodes that represents the individual emission characteristic of the respective light emitting diode.

BRIEF DESCRIPTION OF THE DRAWING

FIG. 1 is a plan top view of a color mixing LED assembly in accordance with the present disclosure.

DETAILED DESCRIPTION OF THE PREFERRED EMBODIMENTS

The invention relates to a color mixing LED assembly that has a carrier and at least three light emitting diodes (LEDs) arranged on the carrier. The carrier can, for example, have an electrically non-conductive carrier substrate (e.g. comprising a ceramic material or a synthetic resin) and electric lines (e.g. conductor tracks composed of metal) provided thereon or therein. The light emitting diodes arranged on the carrier are configured to emit light in mutually different colors, i.e. in mutually different spectral ranges, and hereby to together generate an output radiation that corresponds to an additive color mix. In such an LED assembly, the at least three light emitting diodes can, for example, be configured to emit light in the colors red, green, and blue and hereby to generate an output radiation that at least substantially appears as white light.

Such LED assemblies are used, for example, in the fields of general illumination, automobile passenger compartment illumination, or background illumination of displays.

Due to their manufacture, each of the light emitting diodes has an individual emission characteristic (e.g. an individual wavelength characteristic and/or luminous intensity characteristic). This means that a plurality of light emitting diodes of the same color type that are installed in different LED assemblies of the same type do not necessarily have the same emission characteristics under the same operating conditions (e.g. the same applied voltage and the same temperature). The light emitting diodes of the same color type can, for example, differ from one another with respect to their dominant wavelength or their luminosity density. This has the consequence that there can be visually perceptible differences between the generated output radiation between different LED assemblies of the same type under the same operating conditions. This is especially unwanted when a plurality of LED assemblies of the same kind are arranged next to one another and should generate an output radiation that is as homogeneous as possible.

Indeed it is possible to classify the light emitting diodes according to different parameters of their emission characteristics such as their dominant wavelength, their spectral centroid, or their luminous intensity. The light emitting diodes can therefore be tested with respect to these different parameters by the manufacturer, with the respective light emitting diode being associated with one of a plurality of predefined classes for each of the different parameters. Light emitting diodes that are associated with the same classes with respect to the different parameters of their emission characteristic can thus be selected for the manufacture of a plurality of LED assemblies that should generate the same output radiation relative to one another so that the LED assemblies coincide with respect to their output radiation. Such a selection process, however, requires an undesirably high logistic effort since a large number of possible combinations of parameters and parameter classes of the emission characteristic has to be taken into account or kept available.

The LED assembly of the present disclosure comprises a respective electric driver input for each of the light emitting diodes to supply the light emitting diodes with electrical energy independently of one another. The emission characteristic of the light emitting diodes depends on the respective energy supply. The color mix of the output radiation can thus be set by varying the respective energy supply at the driver inputs. This can be desirable, for example, to set a selectable color temperature on a use of the LED assembly as an illumination apparatus.

This possibility of an individual energy supply of the individual light emitting diodes of the LED assembly can also be used to compensate differences between the individual emission characteristics of a plurality of light emitting diodes of the same color type relative to one another so that a plurality of LED assemblies of the same type arranged next to one another can generate at least substantially the same output radiation by an adapted control of the individual light emitting diodes. For this purpose, a calibration measurement can be carried out for a respective LED assembly such that the light emitting diodes used in the LED assembly are measured with respect to their respective individual emission characteristics, with an individual control characteristic being stored as the result of the calibration measurement in a control unit that is connected to the respective LED assembly in the specific application. In operation of the LED assembly, the control unit controls the energy supply of the individual light emitting diodes of the LED assembly in accordance with the stored control characteristic. It can therefore be achieved in this manner that a plurality of LED assemblies coincide with respect to their output radiation. However, this procedure also means an undesirably high effort on the part of the user, in particular to supply the individual control characteristic to the respective control unit in a simple and failsafe manner.

It is an object of the invention to provide an LED assembly and a manufacturing method for an LED assembly that enable a simplified taking into account of the individual emission characteristic of the individual light emitting diodes for the user to be able to control the respective LED assembly to generate a desired output radiation.

This object is satisfied by an LED assembly having the features of claim 1 and in particular in that the LED assembly further has a calibration information element that includes at least one readable calibration value that represents the individual emission characteristic of the respective light emitting diode for each of the light emitting diodes.

The LED assembly is provided with at least one calibration information element that includes a piece of calibration information on the respective individual emission characteristic of the different light emitting diodes of the LED assembly in a readable manner. The user of the LED assembly can read the piece of calibration information and can convert it in accordance with a simple calculation rule into a control characteristic in accordance with which the LED assembly is controlled in its operation to generate an output radiation having a desired color mix. In operation of the LED assembly, the control unit controls the energy supply of the individual light emitting diodes of the LED assembly in accordance with the stored control characteristic. The respective individual emission characteristic of the individual light emitting diodes can hereby be taken into account in a simple manner. Provision can in particular be made that the user only then reads the information contained in the calibration information element and stores it in a control unit associated with the LED assembly when the LED assembly and associated control unit has already been permanently combined to form an assembly group (for example by installation at a common carrier device and by an electrical connection to one another).

The calibration information of the individual light emitting diodes to be encoded in the calibration information element can be determined on the part of the manufacturer of the LED assembly either before or after the installation of the light emitting diodes at the carrier of the LED assembly, with the logistic effort being reduced when the calibration measurement is only carried out after the light emitting diodes have already been combined to form a fixed unit. In every case, the information contained in the calibration information element for each of the light emitting diodes of the LED assembly includes at least one calibration value that represents the individual emission characteristic of the respective light emitting diode. This at least one calibration value can comprise a measured value of the calibration measurement or a class value derived therefrom in accordance with a predefined scheme for different parameters of the individual emission characteristic. Depending on the kind of calibration information element, it can have a high information density so that the individual emission characteristic of the light emitting diodes can be encoded with a correspondingly high accuracy.

Advantageous embodiments of the invention will be explained in the following.

In accordance with an embodiment, the respective calibration value contained in the calibration information element can represent the value of the dominant wavelength, the value of the spectral centroid and/or the value of the luminous intensity of the respective light emitting diode at a predefined value of the energy supply (e.g. electrical voltage or current applied at the respective driver input).

Said values of the emission characteristic can furthermore be included in the calibration information element for different values of the energy supply (e.g. for different voltage values).

A plurality of calibration values for different other operating conditions (such as the temperature) can furthermore be included in the calibration information element for the respective light emitting diode.

The at least one calibration value contained in the calibration information element can in particular define a characteristic curve or a set of characteristic curves.

The respective calibration value can, as already mentioned, comprise a specific measured value of the underlying calibration measurement. Alternatively to this, namely when a class scheme is defined for the respective parameter of the emission characteristic, the calibration value can comprise one of a predefined plurality of possible class values.

In accordance with an embodiment, the calibration information element can be arranged at a surface of the carrier of the LED assembly. The calibration information element is hereby easily attachable to the LED assembly and is nevertheless easily accessible for reading.

The calibration information element is preferably arranged at a top side of the LED assembly that in particular corresponds to that side of the LED assembly at which the light emitting diodes are also arranged and emit the light. The calibration information element is hereby easily accessible and be read easily, even if the LED assembly and the associated control unit have already been permanently combined to form an assembly or if a plurality of LED assemblies are arranged next to one another.

In accordance with an embodiment, the calibration information element can be optically readable. A simple contactless reading by means of a common method hereby becomes possible (e.g. a camera having an image analyzing device).

The calibration information element can in particular comprise a one-dimensional optical code (e.g. a barcode) or a two-dimensional optical code (e.g. a so-called "QR code", registered trademark). Such one-dimensional or two-dimensional optical codes make a high information density possible and can be reliably read even with small geometrical dimensions.

The optically readable calibration information element does not, however, necessarily have to comprise a code element, but can also comprise at least one numeral, at least one letter, or a combination of at least one numeral and at least one letter. This embodiment has the advantage that the respective piece of calibration information can also be read without an electronic code reader with nevertheless an electronic reading being possible (by image recognition).

In accordance with a particularly advantageous embodiment, the optically readable calibration information element can be formed by a laser engraving. Such a laser engraving can be attached to the LED assembly as part of the manufacturing process of the LED assembly or along a production line in a simple manner at a time at which the piece of calibration information is present (due to a preceding calibration measurement) and a surface of the LED assembly (in particular of the carrier) is exposed and is accessible for the application of the laser engraving.

Alternatively to such a laser engraving, the optically readable calibration information element can, however, also be printed (e.g. as lettering) or chemically applied (etched, for example) to the LED assembly (in particular the carrier).

Experiments have shown that a calibration information element in the form of a two-dimensional optical code applied by laser engraving can also be reliably recognized and optically read at a size of only 0.3 mm×0.3 mm.

Alternatively to an optical readability it is, however, also possible to read the calibration information element contactlessly in another manner, for example capacitively, magnetically, or by radio.

In accordance with a further alternative embodiment, the calibration information element can have a non-volatile electric memory that includes the at least one calibration vale, with this memory being electrically readable, for example via an electrical reading output that is provided at the LED assembly and that enables an electrical connection to a reading device.

In accordance with an embodiment, the LED assembly can comprise three, four, five, or six light emitting diodes arranged on the carrier. The LED assembly comprises at least three light emitting diodes that have different emission characteristics (in particular different wavelength characteristics) to enable an additive color mix by emission of light in different colors. However, more than three light emitting diodes can also be provided to expand the possibility of additive color mixing and/or to provide redundancy or an expanded geometrical distribution with respect to individual colors.

As already mentioned, the at least three light emitting diodes can be configured to emit light in the colors red, green, and blue and hereby to together generate output radiation appearing as white light.

In accordance with an embodiment, the LED assembly can have a reflector to shape the light emitted by the individual light emitting diodes or the output radiation generated by the LED assembly in accordance with a desired geometrical characteristic. Alternatively or additionally, the LED assembly can have a diffuser to mix the light emitted by the individual light emitting diodes as efficiently as possible.

Said driver inputs for the electrical energy supply (e.g. supply voltage) of the individual light emitting diodes can be provided at a side region of the LED assembly or of the carrier, for example. A separate associated ground connection can be provided for every driver input or a common ground connection is present for all the driver inputs of the LED assembly.

The LED assembly is an optoelectronic component. It can in particular be a surface mounted device (SMD). The LED assembly can have a standardized housing shape, for example SMD PLCC-4 or SMD PLCC-6. The dimensions of the outline (length×width) preferably amount to a maximum of approximately 6 mm×5 mm, for example approximately 3.2 mm×2.8 mm or approximately 3.5 mm×2.2 mm. The height preferably amounts to a maximum of approximately 3 mm, for example approximately 1.9 mm or approximately 1.5 mm.

The object of the invention is also satisfied by a manufacturing method having the features of the independent method claim and in particular by a method of manufacturing a color mixing LED assembly comprising the following steps:

providing a carrier;

providing at least three light emitting diodes that are configured to emit light in mutually different colors and whose respective emission characteristics are dependent on their energy supply;

arranging the light emitting diodes on the carrier such that the different colors emitted by the light emitting diodes together generate an output radiation that corresponds to an additive color mix and such that the light emitting diodes can be separately supplied with electrical energy via a respective driver input;

carrying out a calibration measurement to determine at least one calibration value for each of the light emitting diodes that represents an individual emission characteristic of the respective light emitting diode; and providing the carrier with a calibration information element that includes the determined calibration value for each of the light emitting diodes in a readable form.

The different method steps do not necessarily have to be carried out in the named order. The carrying out of the calibration measurement can, for example, take place before or (preferably) after the light emitting diodes have been arranged on the carrier. Depending on the kind of calibration information element, the carrier can be provided with the calibration information element before the calibration values have been determined or have been included in the calibration information element (e.g. if the calibration information element is an electrical store) or after the calibration values have been determined (e.g. if the calibration information element is applied as an optical code).

The carrying out of the calibration measurement can in particular comprise the following steps:

supplying the respective light emitting diode with at least one predetermined value of electrical energy (e.g. voltage value) and measuring at least one associated value of the individual emission characteristic of the respective light emitting diode (e.g. value of the dominant wavelength); and selecting the calibration value in dependence on the measured value of the individual emission characteristic of the respective light emitting diode.

The selection of the calibration value can, for example, comprise an association with one of a plurality of value ranges that correspond to different predefined value classes. In this respect, a plurality of different parameters of the individual emission characteristics and a plurality of parameter classes can be provided for each parameter.

In another respect, the LED assembly named in connection with the manufacturing method can have the features of the LED assembly in accordance with the above-explained embodiments.

The invention will be described in the following only by way of example with reference to the drawing.

FIG. 1 shows a color mixing LED assembly 11 in a plan top view. The LED assembly 11 has a carrier 13 in the form of a housing that has a frame-like marginal region 15 at its top side. An installation region 17 of the carrier 13 is located within the marginal region 15. Three light emitting diodes 21R, 21G, 21B are arranged in the installation region 17. The light emitting diodes 21R, 21G, 21B are configured to emit light in the colors or spectral ranges red, green, and blue and hereby to together generate an output radiation that corresponds to an additive color mix and substantially appears as white light. The additive mixing of the three colors is supported by a diffusely transparent diffuser 23 that is not shown in any more detail and that covers the light emitting diodes 21R, 21G, 21B.

To be able to supply the light emitting diodes 21R, 21G, 21B with electrical energy, the LED assembly 11 has a corresponding number of driver inputs and associated ground connectors that project laterally as contact elements from the carrier 13 or from the housing and extend toward the lower side of the LED assembly 11 (not shown). A driver input 25R having a ground connector 27R is associated with the light emitting diode 21R. A driver input 25G having a ground connector 27G is associated with the light emitting diode 21G. A driver input 25B having a ground connector 27B is associated with the light emitting diode 21B. The respective light emitting diode 21R, 21G, 21B has two terminals that are connected to the respective driver input 25R, 25G, 25B or ground connector 27R, 27G, 27B via electric connection lines of the carrier 13 (not shown).

Due to the manufacture, each of the light emitting diodes 21R, 21G, 21B has an individual emission characteristic, in particular an individual wavelength characteristic (emission spectrum, i.e. relative intensity in dependence on the wavelength) and an individual luminous intensity characteristic (luminous intensity in the unit mcd). For example, the light emitting diodes 21R of a plurality of different, but similar, LED assemblies 11 can differ from one another with respect to their dominant wavelengths under the same operating conditions (e.g. same applied voltage and same temperature).

The emission characteristic of the light emitting diodes 21R, 21G, 21B is furthermore dependent on the respective energy supply, that is on the electrical voltage and/or current applied at the driver inputs 25R, 25G, 25B. This property can be used to set the color mix of the output radiation by a suitable adaptation of the respective energy supply at the driver inputs 25R, 25G, 25B and additionally to take account of the respective individual light emission characteristics of the light emitting diodes 21R, 21G, 21B. In other words, a difference of the respective individual emission characteristics from a reference value can be compensated in that the energy supply of the respective light emitting diode 21R, 21G, 21B is increased or decreased. A corresponding control of the light emitting diodes 21R, 21G, 21B by means of an associated control unit, however, requires that the individual emission characteristic is known with respect to each light emitting diode 21R, 21G, 21B of the LED assembly 11.

To simplify such an adapted control of the light emitting diodes 21R, 21G, 21B, the LED assembly 11 has two calibration information elements 31a, 31b that include a readable calibration value for each of the light emitting diodes 21R, 21G, 21B that represents the individual emission characteristic of the respective light emitting diode 21R, 21G, 21B. In the embodiment shown here, the calibration information element 31a has a first calibration value for each of the light emitting diodes 21R, 21G, 21B that represents an individual wavelength characteristic of the respective light emitting diode 21R, 21G, 21B. The calibration information element 31b includes a second calibration value for each of the light emitting diodes 21R, 21G, 21B that represents an individual luminous intensity characteristic of the respective light emitting diode 21R, 21G, 21B. These calibration values can be included as physical values (e.g. as a dominant wavelength in the unit nm or as a luminous intensity in the unit mcd) or as a class value in accordance with a predefined class scheme.

The two calibration information elements 31a, 31b are arranged at the top side of the carrier 13 or of the housing within the frame-like marginal region 15. The calibration information elements 31a, 31b are formed by a respective two-dimensional optical code that is formed by a laser engraving in the embodiment shown here.

The calibration information elements 31a, 31b can thus be optically read in a simple manner, for example by means of a camera, to detect the calibration information, that is said calibration values, contained therein. The reading of the calibration values and the storing of the read calibration values in a control unit associated with the respective LED assembly 11 can in particular take place on the assembly of an assembly group that comprises one or more LED assemblies 11 and at least one associated control unit. A camera for reading the calibration values from the calibration information elements 31, 31b can, for example, be provided along a production line in which a carrier device is mounted with one or more LED assemblies 11 and with the associated control unit, with the read and optionally decoded or converted calibration values of the respective light emitting diodes 21R, 21G, 21B being stored in the associated control unit to enable an individual control characteristic. The associated control unit is preferably already fixedly connected to the respective LED assembly 11 or to the common carrier device at this time so that the logistic effort is minimized and errors due to incorrect associations (confusion between different control units) can be reliably avoided.

The determination of the calibration information (corresponding to the individual emission characteristic) of the individual light emitting diodes 21R, 21G, 21B can take place by a corresponding calibration measurement at the manufacturer's of the LED assembly, in particular after the light emitting diodes 21R, 21G, 21B have already been mounted on the carrier 13 of the respective LED assembly 11. For the carrying out of the calibration measurement, the respective light emitting diode 21R, 21G, 21B can be supplied with a predefined value of electrical energy (e.g. predefined voltage value), with at least one associated value of the individual emission characteristic of the light emitting diode 21R, 21G, 21B (e.g. dominant wavelength) being measured. After detecting the respective piece of calibration information, a calculatory analysis and/or a conversion can take place (e.g. threshold comparison or association of the measured value to one of a plurality of predefined classes). The respective calibration value resulting herefrom is included in the calibration information element 31a, 31b of the respective LED assembly 11, with the calibration information element 31a, 31b only being applied to the respective LED assembly 11 in the embodiment described here (two-dimensional optical code in the form of a laser engraving) when all the calibration values included therein have been determined.

The invention claimed is:

1. A color mixing LED assembly comprising
a carrier and at least three light emitting diodes that are arranged on the carrier and that are configured to emit light in mutually different colors and together generate an output radiation that corresponds to an additive color mix,
wherein each of the light emitting diodes has an individual emission characteristic; and
comprising a respective driver input for each of the light emitting diodes to supply the light emitting diodes with electrical energy,
wherein the emission characteristics of the light emitting diodes are dependent on a respective energy supply so that the color mix of the output radiation can be set by varying the respective energy supply at the driver inputs,
wherein the LED assembly furthermore comprises at least one optically readable calibration information element formed as a laser engraving that includes at least one readable calibration value for each of the light emitting diodes that represents the individual emission characteristic of the respective light emitting diode.

2. The color mixing LED assembly in accordance with claim 1,
wherein the calibration value represents at least one of
a value of a dominant wavelength;
a value of a spectral centroid; or
a value of a luminous intensity
of the respective light emitting diode at a predefined value of the energy supply.

3. The color mixing LED assembly in accordance with claim 1,
wherein the calibration value comprises one of a predefined plurality of possible class values.

4. The color mixing LED assembly in accordance with claim 1,
wherein the calibration information element is arranged at a surface of the carrier.

5. The color mixing LED assembly in accordance with claim 1,
wherein the calibration information element is arranged at a top side of the LED assembly.

6. The color mixing LED assembly in accordance with claim 1,
wherein the LED assembly comprises at least two calibration elements.

7. The color mixing LED assembly in accordance with claim 6,
wherein each calibration element comprises a different readable calibration value.

8. The color mixing LED assembly in accordance with claim 1,
wherein the calibration information element comprises a two-dimensional optical code.

9. The color mixing LED assembly in accordance with claim 1,
wherein the LED assembly comprises three, four, five, or six light emitting diodes arranged on the carrier.

10. The color mixing LED assembly in accordance with claim 1,
wherein the at least three light emitting diodes are configured to emit light in the colors red, green, and blue and hereby to together generate an output radiation that at least substantially appears as white light.

11. The color mixing LED assembly in accordance with claim 1,
wherein the LED assembly furthermore comprises at least one of a reflector or a diffuser.

12. A method of manufacturing a color mixing LED assembly comprising the following steps:
providing a carrier;
providing at least three light emitting diodes that are configured to emit light in mutually different colors and that have respective emission characteristics depending on their energy supply;
arranging the light emitting diodes on the carrier such that the different colors emitted by the light emitting diodes together generate an output radiation that corresponds to an additive color mix and such that the light emitting diodes can be separately supplied with electrical energy via a respective driver input;
carrying out a calibration measurement to determine at least one calibration value for each of the light emitting diodes that represents an individual emission characteristic of the respective light emitting diode; and
providing the carrier with an optically readable calibration information element formed as a laser engraving that includes the determined calibration value for each of the light emitting diodes in a readable form.

13. The method in accordance with claim 12,
wherein the step of carrying out a calibration measurement comprises
supplying the respective light emitting diode with at least one predetermined value of electrical energy and measuring at least one associated value of the individual emission characteristic of the respective light emitting diode; and
selecting the calibration value in dependence on the measured value of the individual emission characteristic of the respective light emitting diode.

14. The method in accordance with claim 12, wherein the calibration value comprises one of a predefined plurality of possible class values.

15. The method in accordance with claim 12, further comprising arranging the calibration information element at a top side of the LED assembly.

16. The method in accordance with claim 12, wherein the calibration information element comprises a two-dimensional optical code.

17. The method in accordance with claim 12, further comprising configuring the at least three light emitting diodes to emit light in the colors red, green, and blue and hereby to together generate an output radiation that at least substantially appears as white light.

18. A color mixing LED assembly comprising:
a carrier and at least three light emitting diodes that are arranged on the carrier and that are configured to emit light in mutually different colors and together generate an output radiation that corresponds to an additive color mix,
wherein each of the light emitting diodes has an individual emission characteristic; and comprising a respective driver input for each of the light emitting diodes to supply the light emitting diodes with electrical energy, wherein the emission characteristics of the light emitting diodes are dependent on a respective energy supply so that the color mix of the output radiation can be set by varying the respective energy supply at the driver inputs, wherein the LED assembly furthermore comprises at least one first calibration information element that includes at least one first readable calibration value for each of the light emitting diodes that represents the individual emission characteristic of a respective light emitting diode, wherein the LED assembly furthermore comprises at least one second calibration information element that includes at least one second readable calibration value for each of the light emitting diodes that represents the individual emission characteristic of a respective light emitting diode; and wherein the first readable calibration value and the at least one second readable calibration value represent different calibration values.

19. The color mixing LED assembly of claim 18, wherein the at least one first calibration information element and the at least one second calibration information element are optically readable.

20. A method of manufacturing a color mixing LED assembly comprising the following steps:

providing a carrier;

providing at least three light emitting diodes that are configured to emit light in mutually different colors and that have respective emission characteristics depending on their energy supply;

arranging the light emitting diodes on the carrier such that the different colors emitted by the light emitting diodes together generate an output radiation that corresponds to an additive color mix and such that the light emitting diodes can be separately supplied with electrical energy via a respective driver input;

carrying out a calibration measurement to determine at least one calibration value for each of the light emitting diodes that represents an individual emission characteristic of the respective light emitting diode;

providing the carrier with at least one first calibration information element that includes at least one first readable calibration value for each of the light emitting diodes; and providing the carrier with at least one second calibration information element that includes at least one second readable calibration value for each of the light emitting diodes, wherein the first readable calibration value and the second readable calibration value represent different calibration values.

\* \* \* \* \*